(12) United States Patent
Koops et al.

(10) Patent No.: US 6,232,046 B1
(45) Date of Patent: May 15, 2001

(54) PROCESS FOR IMPROVING THE CONTRAST IN THE STRUCTURE OF 3-DIMENSIONAL SURFACES

(75) Inventors: Hans Wilfried Peter Koops, Ober-Ramstadt; Sergey Babine, Griesheim; Gerold Dahm, Erlenbach, all of (DE); Alexey Holopkin, Moscow (RU)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/029,700

(22) PCT Filed: Aug. 24, 1996

(86) PCT No.: PCT/DE96/01580

§ 371 Date: Sep. 22, 1998

§ 102(e) Date: Sep. 22, 1998

(87) PCT Pub. No.: WO97/10088

PCT Pub. Date: Mar. 20, 1997

(30) Foreign Application Priority Data

Aug. 30, 1995 (DE) ............................................. 195 31 859
Jul. 13, 1996 (DE) ............................................. 196 28 353

(51) Int. Cl.⁷ ...................................................... G03F 7/26
(52) U.S. Cl. .......................... 430/323; 430/329; 430/330; 430/942
(58) Field of Search ................................. 430/296, 313, 430/323, 325, 330, 942, 329; 216/16, 55, 62, 63, 67, 87

(56) References Cited

U.S. PATENT DOCUMENTS

| | | | |
|---|---|---|---|
| 4,430,153 | 2/1984 | Gleason et al. | 156/643 |
| 4,560,641 | 12/1985 | Kokaku et al. | 430/312 |
| 4,578,587 | 3/1986 | Behringer et al. | 250/492.2 |
| 5,104,684 | 4/1992 | Tao et al. | 427/38 |

(List continued on next page.)

FOREIGN PATENT DOCUMENTS

| | | |
|---|---|---|
| 37 05 361 | 8/1988 | (DE) . |
| 41 12 695 | 7/1992 | (DE) . |
| 41 09 972 | 8/1992 | (DE) . |
| 42 02 651 | 8/1993 | (DE) . |
| 44 16 597 | 11/1995 | (DE) . |
| 195 06 880 | 8/1996 | (DE) . |
| 196 28 353 | 3/1997 | (DE) . |
| 196 30 705 | 3/1997 | (DE) . |
| 195 45 721 | 6/1997 | (DE) . |
| 0 064 101 | 11/1982 | (EP) . |
| 0 226 893 | 7/1987 | (EP) . |
| 0 571 727 | 12/1993 | (EP) . |
| 2 305 440 | 4/1997 | (GB) . |
| 95/02472 * | 1/1995 | (WO) . |
| WO 95/20831 | 8/1995 | (WO) . |
| WO 95/31020 | 11/1995 | (WO) . |

OTHER PUBLICATIONS

Babin, S.V. et al, Investigation of new dry high sensitive resist using 100 kV electron lithography, Microelectronics Engineering, vol. 23, pp. 303–305, 1994.*

Korchkov, V.P. et al, All–dry vacuum submicron lithography, Thin Solid Films, vol. 101, pp. 369–372, 1983.*

Babin et al., "Dry resist technology to fabricate optimized micro–lenses centered to the end of a monomode fiber with electron beam lithography", SPIE, vol. 2863, Aug. 5, 1996, pp. 95–101.

(List continued on next page.)

Primary Examiner—Kathleen Duda
(74) Attorney, Agent, or Firm—Kenyon & Kenyon

(57) ABSTRACT

Three-dimensional, patterned surfaces, which were produced by dry-etching technology and have zones with different degrees of polymerization, are subjected to a time-limited dry-etching process in fluorine-containing plasma, In this context, an ablation process is used, which proceeds as a function of time, from incompletely polymerized material to completely polymerized material. Weakly polymerized regions, in particular those resulting from the proximity effect, may be removed.

4 Claims, 1 Drawing Sheet

U.S. PATENT DOCUMENTS

| | | | |
|---|---|---|---|
| 5,157,547 | 10/1992 | Paesold | 359/581 |
| 5,288,368 * | 2/1994 | DeMarco et al. | 156/643 |
| 5,298,112 * | 3/1994 | Hayasaka et al. | 156/643 |
| 5,384,464 | 1/1995 | De Fornel et al. | 250/492.2 |
| 5,454,919 | 10/1995 | Hill et al. | 204/192.11 |
| 5,561,675 | 10/1996 | Bayon et al. | 372/6 |
| 5,578,821 | 11/1996 | Meisberger et al. | 250/310 |
| 5,811,211 | 9/1998 | Tanaka et al. | 430/30 |
| 5,849,639 * | 12/1998 | Molloy et al. | 438/714 |
| 5,858,863 | 1/1999 | Yokoyama et al. | 438/514 |

OTHER PUBLICATIONS

Babin et al. "Three–dimensional electron–beam lithography using an all–dry resist process", Journal of Vacuum Science and Technology, vol. 14, No. 6, Dec. 1996, pp. 3860–3863.

Stemmer et al. "Design and fabrication of multilevel diffractive optical elements (DOEs) and holographic optical elements (HOEs)" Microelectronic Engineering, vol. 21, Apr. 1993, pp. 471–474.

Zengerle et al. "Fabrication of Optical Beamwidth Transformers for Guided Waves on InP Using Wedge–Shaped Tapers", J. Vac. Sci. Technol. B9 (6) (1991), p. 3459.

Unger et al. "High Resolution Electron Beam Lithography for Fabricating Visible Semiconductor Lasers with Curved Mirrors and Integrated Holograms", Microelectronic Engineering, 23 (1994), p. 461–464.

Presby et al. "Near 100% Efficient Fibre Microlenses" Electronics Letters, Mar. 12, 1992, vol. 28, No. 6, pp. 582–584.

Dändliker et al. "Photolithography with Lenslet Arrays", IG–Fachbericht 132 Vacuum Electronics and Displays, 1995, pp. 241–246.

Stemmer et al. "Design and Fabrication of Synthetic Lenses in Silicon" SPIE, vol. 1732 Holographics International 92, 77–88.

Dix et al. "Electron–Beam Fabrication and Focused Ion–Beam Inspection of Submicron Structured Diffreactive Optical Elements", J. Vac, Sci, Technol. B 12(6) (1994) pp. 3708–3711.

Maker et al. "Phase holograms in polymethylmethacrylate", J. Vac. Sci. Technol. B 10(6) (1992) p. 2516–2519.

Koops et al. "High Resolution Electron Beam Induced Deposition" Proc. 31 Int. Symp. On Electron, Ion and Photon Beams, J. Vac. Sci. Technol. B 6(1)(1988), p. 477–481.

Ochiai et al. "Focused IonBeam Technology", Solid State Technologies, Nov. 1987, pp. 75–79.

Matsui et al. "New Selective Deposition Technology by Electron Beam Induced Surface", J. Vac. Sci. Technol. B 4(1), Jan./Feb. 1986, pp. 299–304.

Paek et al. "Formation of a Spherical Lens at Optical Fiber Ends with A $CO_2$ Laser", Applied Optics vol. 14, No. 2, Feb. 1975, pp. 294–298.

Glas et al. "A high power neodymium–doped fiber laser using a novel fiber geometry", Optics Communications, 141 (1997), pp. 336–342.

Pendry, "Photonic band structures", Journal of Modern Optics, 1994, vol. 41, No. 2, pp. 209–229.

Smith et al. Defect studies in a two–dimensional periodic photonic lattice Journal of Modern Optics, 1994, vol. 41, No. 2, 395–404.

Koops et al. "Evaluation of the dry resist Vinyl–T8 and ist application to optical microlenses" Microelectronic Engineering 30 (1996), pp. 539–542.

Shigihara et al. "Achieving Broad–Area Laser Diodes with High Output Power and Single–Lobed Far–Field Patterns in the Lateral Direction by Loading a Modal Reflector", IEEE Journal of Quantum Electronics, vol. 30, No. 8, Aug. 1994, pp. 1683–1690.

Langheinrich et al. "Nanostructure fabrication using lithium fluoride films as an electron beam resist" J. Vac. Sci. Technol. B 10(6) Nov./Dec. 1992, pp. 2868–2872.

Prof. Stuke, "3–Dimensionale Laser–Photoendeposition" Göttingen, Jap. J. Appl. Phys. (1994).

O. Joubert, et al. "Plasma polymerized all–dry resist process for 0.25µm photolithography", J. Vac. Technol. B 12(6) (1995) pp. 3909–3913.

P. Guttmann et al. "Behavior of Amorphous $As_2S_3$ Layers After Photon Electron and X–ray Exposures" SPIE 1361 (1990) pp. 999–1010.

V.P. Korchkov, et al. "Thin Solid Films" (1983), pp. 396–372.

* cited by examiner

PROCESS FOR IMPROVING THE CONTRAST IN THE STRUCTURE OF 3-DIMENSIONAL SURFACES

FIELD OF THE INVENTION

The present invention relates to patterning of a three-dimensional surface using dry resist technology, and in particular, to a process for improving the contrast in the patterning produced using polymerizable dry resists having a high silicon dioxide content.

RELATED TECHNOLOGY

Efforts have been underway for quite some time to produce and employ radiation-sensitive coatings to be applied in dry processes.

Efforts have been disclosed for producing electron-sensitive polymerizates in the gas discharge, the applications for which remain undetermined. See 1. O. Joubet, T. Weidmann, A. Joshi, R. Cirelli, S. Stein, J. T. C. Lee, S. Vaidya: "Plasma polymerized all-dry resist process for 0.25 μm photolithography", J. Vac. Technol. B 12(6)(1995), 3909.

At the Techno Center in Moscow, a substance has been synthesized as dry resist for corpuscular beam and optical lithography. This substance works with a sensitivity similar to that of the known electron resist PMMA (polymethacrylate), but as a negative resist. This resist has a poor contrast, and its resolution capability is only conditionally suitable for solids used in lithography. It is vapor-deposited under a vacuum and also dry-developed under a vacuum. See Layers After Photon, Electron, and X-ray Exposures", SPIE 1361 (1990) 999.

Wet process steps become superfluous. Therefore, the resist is very clean in terms of the environment. See 3. V. P. Korchkov, T. N. Martynova, V. S. Damlovich: "Thin Solid Films", vol. 101, 1983, pp. 369–372.

The resist has a high etch resistance to metal-etching plasma processes and is, therefore, preferably used as a good etching mask.

SUMMARY OF THE INVENTION

It is the aim of the present invention to effect a better contrast of the dry resist and an improved resolving power on solids, enabling the dry resist to be used for optical lithography as well. This not only guarantees a clean process control, but also ensures that no substances harmful to the environment or deleterious to health is released in the process.

The object of the present invention and achievement thereof are based on having a dry-etch step follow the thermal development of the dry resist, which will substantially improve, in particular, the contrast of the dry resist. During irradiation, the base material having a high silicon dioxide content polymerizes due to the bombardment by rays. Since during electron exposure, a large portion of the radiation is scattered into the vicinity of the exposed locations due to the proximity effect, a weakly polymerized material is found even in regions that are not directly exposed, and this material can no longer be removed by the thermal development. The process of the present invention is preferably directed to the removal of this weakly polymerized material that causes the poor contrast. This is based on an etch attack by reactive fluorine ions which are formed in the gas discharge in the parallel plate reactor out of $CF_4$.

In this way, the weakly polymerized material is likewise removed in a dry process. An additional aftertreatment is not needed. With the process of the present invention, one achieves an improved contrast, as well as an increased resist resolution capability.

BRIEF DESCRIPTION OF THE DRAWING

The present invention may be more easily understood with reference to the following figure.

DETAILED DESCRIPTION

Figure 1:
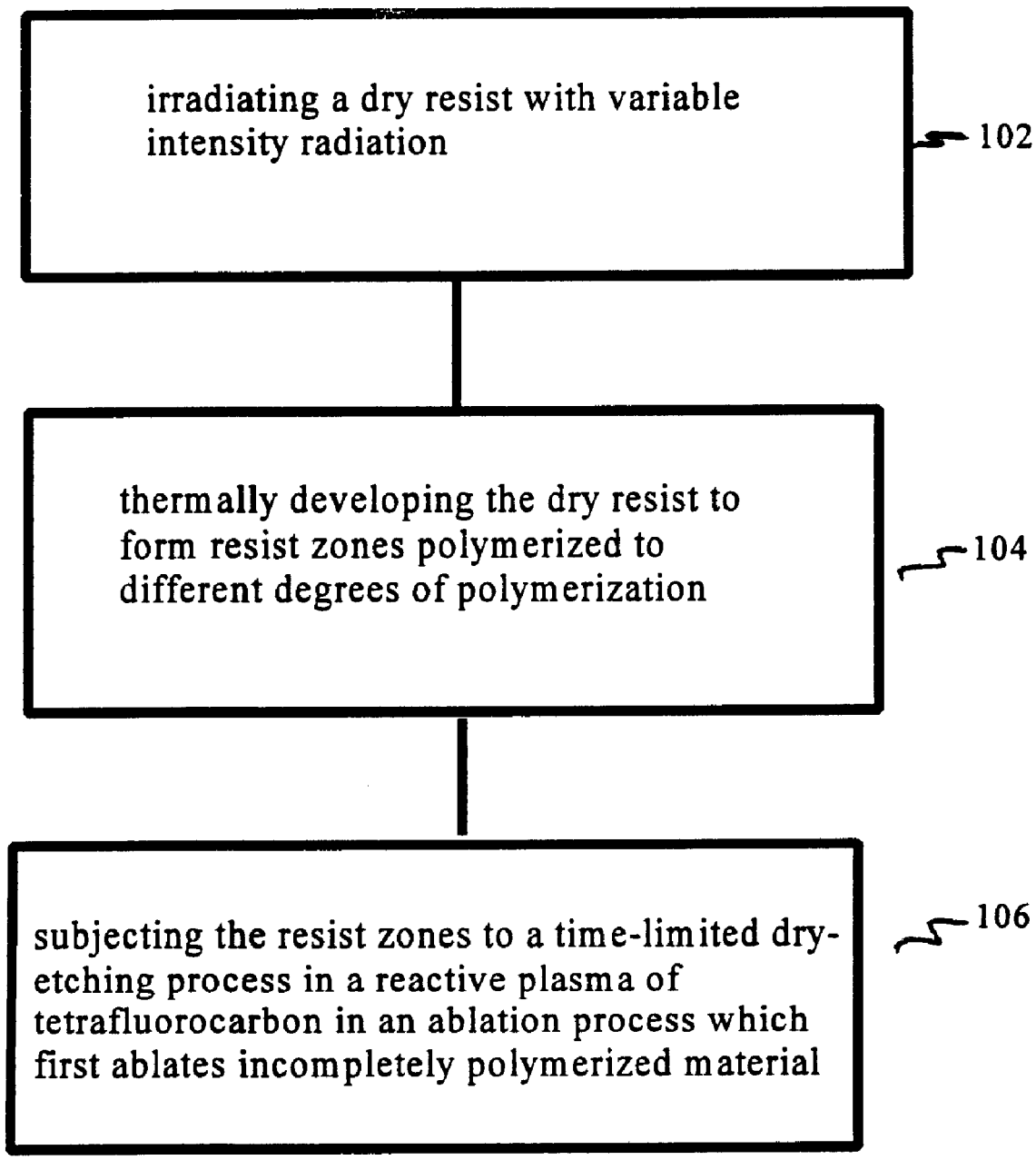
FIG. 1 is a block diagram of a method in accordance with a preferred embodiment of the present invention.

The object of the present invention and achievement thereof shall be elucidated on the basis of an exemplary embodiment, as illustrated in FIG. 1.

In the exemplary embodiment, octavinylsilsesquioxane is used as dry resist. This dry resist, which works as a negative resist, has a sensitivity similar to that of the known electron resist PMMA (polymethacrylate).

Octavinylsesquisiloxane has a poor contrast, as well as only a conditionally suitable resolving power on solids used for lithography. The resist is vapor deposited under a high vacuum at low temperatures onto the three-dimensional surface. The resist is irradiated through electron exposure, or, through ultraviolet light or ion beam exposure. This radiation exposure is denoted by numeral 102 in FIG. 1. The resist polymerizes by the action of the radiation. As a result, it acts as a negative resist. In response to differently dispensed electron energies, the resist has different sensitivities, which, in conjunction with the variably dispensed electron energies, also effect a different degree of polymerization of the resist. The irradiated resist is likewise developed under a high vacuum through heating to temperatures of up to 200° C. as denoted by numeral 104 in FIG. 1. The material surface is formed with zones which exhibit a different.

In the case of electron exposure, a large portion of the radiation is scattered into the vicinity of the exposed locations due to the proximity effect. A weak polymerization effect occurs in regions that are not directly exposed, so that polymerized material is present there to a small extent and is not able to be removed in the thermal development. Therefore, the contrast that is attainable with this process is very low. Thus, up to this step, the process is hardly applicable to high-resolution lithography.

In accordance with the present invention, to enhance the contrast following the thermal development, another process step comprising a dry-etching process is added, as denoted by numeral 106 in FIG. 1. In this context, the polymerized material is exposed in a parallel plate reactor to a reactive plasma of tetrafluorocarbon. Since the polymerizate exhibits a different degree of polymerization and, thus, a different hardness, the softer, incompletely polymerized material is ablated first. This substantially increases the contrast of the resist's characteristic curve, an excellent contrast of greater than 2.9 being attainable. As a result, the resist may be used as negative resist in lithographic tasks. There is no need for a subsequent development or purification process. In this process, pattern generating may be achieved without "wet" process steps, eliminating the need for noxious solvents. Since the application of the resist and is thermal development also take place under a high vacuum, any endangerment to health is effectively eliminated.

Contrast may be described by the equation $\gamma=[\log(D/D_0)]^{-1}$. The present invention increases the contrast from 0.71, following the thermal development step, to 2.9. In a few areas, a contrast of 4.6 is achieved. This represents a significant improvement and makes it possible for this resist to be used lithographically as well. Following the dry etch development step of the present invention no further steps are required for completion.

With the dry development step, an improved resolving power is also achieved on thick substrates, where the resolution is degraded by electron backscattering.

The present invention also has the particular distinction that no substances harmful to the environment or deleterious to health are released during the process. All processes take place under a high vacuum.

What is claimed is:

1. A method for improving the contrast in the patterning of a three-dimensional surface produced by dry resist technology using at least one polymerizable dry resist having a high silicon dioxide content, the dry resist acting as a negative resist, the method comprising the steps of:

irradiating the dry resist with variable intensity radiation;
   thermally developing the dry resist to form resist zones, the resist zones being each polymerized to a different degree of polymerization; and
   completing the patterning of the three-dimensional surface by subjecting the resist zones to a time-limited dry etching process in fluorine-containing plasma in an ablation process which first ablates incompletely polymerized material.

2. The method as recited in claim 1 wherein the dry etching process is timed so as to ablate only the resist zones formed because of a proximity effect.

3. The method as recited in claim 1 wherein the dry resist is made of octavinylsilsesquioxane.

4. The method as recited in claim 1 wherein the etching process takes place in a parallel plate reactor using a process chamber of aluminum, and wherein the fluorine-containing plasma includes a reactive plasma of tetrafluorocarbon.

* * * * *